(12) United States Patent
Drewery

(10) Patent No.: US 6,699,396 B1
(45) Date of Patent: Mar. 2, 2004

(54) METHODS FOR ELECTROPLATING LARGE COPPER INTERCONNECTS

(75) Inventor: John Stephen Drewery, Alameda, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 09/895,678

(22) Filed: Jun. 29, 2001

(51) Int. Cl.[7] .................................................. B44C 1/22
(52) U.S. Cl. ......................................................... 216/40
(58) Field of Search ................................. 438/618–627, 438/631, 633, 634, 639, 667–680, 687; 216/13, 17, 18, 40

(56) References Cited

U.S. PATENT DOCUMENTS

2002/0137337 A1 * 9/2002 Lu et al. ..................... 438/687

OTHER PUBLICATIONS

"Microposit® LOL™ 1000 and 2000 Liftoff Layers," pp 1–6.

\* cited by examiner

*Primary Examiner*—Gregory Mills
*Assistant Examiner*—Roberts Culbert

(57) ABSTRACT

A method for forming conductive features in dielectric materials is disclosed which includes providing a dielectric layer and forming a release layer over the dielectric layer. Then a feature is defined into the each of the release layer and the dielectric layer and a conductive material is filled over the release layer and into the feature. The release layer is then removed where the removing serves to remove the conductive material from over the dielectric layer previously covered by the release layer.

7 Claims, 7 Drawing Sheets

METHODS FOR ELECTROPLATING LARGE COPPER INTERCONNECTS

BACKGROUND OF THE INVENTION

1. Field of the Invention

This invention relates generally to the field of computing technology and more particularly concerns optimal methods for electroplating copper interconnects.

2. Description of the Related Art

In most existing IC structures, the speed at which a signal can be transmitted along an interconnect of length L is limited by the time constant of approximately $RCL^2$ where R is the resistance and C the capacitance of the interconnect, both per unit length. Exemplary figures of existing IC structures may be found in IEEE Trans. Electron Devices, ED-32 (5), pp. 903–909 (1985) written by H. B. Bakoglu and J. D. Meindl. This reference is incorporated by reference.

To obtain signal transit at light speeds, an electrical transmission line should be used. This is a well controlled interconnect with the property that the series resistance RL is much less than the intrinsic impedance defined as $\sqrt{(L/C)}$ where L is the inductance and C the capacitance of the structure, per unit length. The design of such lines may assume that the surrounding wiring structures constitute an effective ground, or shielding structures may be employed (such as dedicated power line planes decoupled well to ground), or more specialized structures such as a coplanar waveguide can be used. The speed of propagation of an electrical signal in such a line is $1\sqrt{L/C}$, the speed of light in the surrounding dielectric.

Unfortunately, the intrinsic impedance Z of such lines cannot exceed approximately 376 ohms in free space, or 248 ohms in a dielectric with dielectric constant 2.3 (at the frequency of interest). A typical value would be 25–100 ohms. Because of this, the line length that can satisfy the equation RL<Z is increasingly limited as one proceeds to smaller wire dimensions. In a wire with 1 micron side, made of copper and operating at a low frequency, R is 198 ohms/cm. At higher frequencies, around 10 GHz, skin effects in the wire increase this value. Clearly the dimension of the wire must be increased if the RC delay is to be avoided, or the length of the line must be kept short. At present, a common solution to the RC delays is to add repeaters along the wire at intervals short enough that the transit time is kept well under $1/(RCL^2)$. This has the disadvantage that quite large transistors are needed to drive the lines, which use valuable die area. Also, contacts must be made through the entire metallization stack, with low resistance, to these transistors, which leads to 'via blockage', a name referring to the restrictions on wire routing in the intervening layers that is caused by the contact via. Furthermore each repeater introduces a propagation delay. The power drawn by the large number of repeaters is also a concern. It would be desirable if line delays could be reduced by the use of large enough wires that RL can be kept below Z for a substantial wire length.

FIG. 1 shows a graph 20 illustrating line resistance per cm for various signal frequencies with a square copper wire of sensitivity 2.0 $\mu\Omega$cm and indicates the approximate resistance per cm of square sectioned copper wires of various dimensions. Graph 20 has plots 22, 24, 26, 28, and 30 of line resistance per cm for signal frequencies, 1 GHz, 3 GHz, 10 GHz, 30 GHz, and 100 GMz respectively. For a die of 25 mm per side, consistent with future die sizes in high performance applications, the Manhattan distance from corner to corner is 5 cm. The Manhattan distance is the shortest distance between two points along a rout that is constrained to run only in two predefined orthogonal directions (usually parallel to the edges of the die). An unrepeatered line for this length, to run at 3 GHz signal frequency, should be at least 5 microns on a side in order for signals to pass at the speed of light in the dielectric. In FIG. 1 it has been, assumed that for adequate signal transmission the wire should obey the rule RL<Z at three times the signal frequency.

Existing IC manufacturing techniques are poorly suited to production of such wires. The usual process for deposition of finer copper line structures (up to about 1.0 micron) uses the 'damascene' technique. To deposit a damascene wire, a trench is first etched, a thin barrier layer is applied, and then a 'seed layer', usually of copper and always of a good conductor, is deposited. The entire wafer is then electroplated. The wafer is then chemomechanically polished until all the overlying copper is removed and an inlaid copper line remains.

Unfortunately most plating techniques deposit a layer of metal in the field whose thickness is on the same order of the depth of the trench. In the case of a thick line, all of this material must be removed in a uniform manner. This is a time consuming and wasteful process.

The deposition of copper lines with widths of 100 microns and above is generally done by a subtractive process in which a thin continuous copper line is deposited, a resist is applied and patterned, and a wet etch process used to pattern the wires. Unfortunately this technique loses its usefulness for wires with height close to their width because of undercutting by the isotropic etch. This undercutting can be alleviated by electrochemical etching but this is a difficult process. Such an exemplary process is described by M. Datta in IBM J. Res. Develop. 42 (5) pp. 655–669 (1998). This document is hereby incorporated by reference.

Furthermore the pitch of such wiring is severely restricted, and the resists common used perform poorly at feature sizes on the order of 10 microns. For on-die interconnects the wires are required to have aspect ratio (height/width) of one and above in order to reduce capacitance and allow for enough individual interconnections.

Plating of lines of 10–100 micron linewidth can be done by 'through-mask' plating. An exemplary through-mask process may be seen in S. Krongelb, L. T. Romankiw, and J. A. Tornello, Id. p. 575–585 (1998). A dielectric is coated with adhesion and seed layers; resist is then applied, exposed, and developed to leave the regions where plating is to occur exposed. The seed layer is attached to the negative terminal of an electrochemical cell and copper is electroplated. It will deposit only in the regions not covered by the resist. Unfortunately such a technique is time consuming. This is because the plating rate of the lines is strongly dependent upon the local pattern density, that is the fraction of area not covered by copper. This non-uniformity is increased as the plating current increases, which means that the current cannot be increased to allow faster plating when thick lines are needed; in fact the current density must generally be reduced, leading to a superlinear dependence of plating time on wire thickness. This pattern dependence exists in damascene processing but is much less pronounced. Through-mask processes would be economical for wafer processing only when large batches of wafers were coated in an inexpensive tool, because of the time needed for plating, but unfortunately, tools for electroplating semiconductor wafers are costly. Following the plating process the resist is stripped and the seed and adhesion layers removed, usually by wet etch. In all of these wet processes, backside wafer contamination with copper will occur unless specialized equipment is used or the rear of the wafer is protected in some way. Backside contamination is bad because if the copper contamination migrates to the transistor junctions the junctions will be destroyed.

In view of the above, a technique which enables more effective and less time consuming plating of wafers while reducing or even eliminating the CMP process is needed.

SUMMARY OF THE INVENTION

Broadly speaking, the present invention fills these needs by providing a method for more effective plating of wafers while reducing or even eliminating the CMP process. It should be appreciated that the present invention can be implemented in numerous ways, including as a process, an apparatus, a system, computer readable media, or a device. Several inventive embodiments of the present invention are described below.

In one embodiment a method for forming conductive features in dielectric materials is disclosed which includes providing a dielectric layer and forming a release layer over the dielectric layer. Then a feature is defined into the each of the release layer and the dielectric layer and a conductive material is filled over the release layer and into the feature. The release layer is then removed where the removing serves to remove the conductive material from over the dielectric layer previously covered by the release layer.

In another embodiment, a method for electroplating copper interconnects in a dielectric layer is provided which includes forming a release layer over the dielectric layer and patterning the release layer to form an exposed outline of a feature over the dielectric layer. Then the dielectric layer is etched in the exposed outline of the feature where the etching is defined at least partially into the dielectric layer to define an etched feature. The method also includes blanket lining the release layer and the dielectric layer where the blanket lining covers the release layer and the etched feature. Then the method applies a copper material over the blanket lining and into the etched feature. The release layer is then dissolved where the dissolving removes the blanket lining and the copper material from over the dielectric layer, while leaving the copper material in the etched feature.

In another embodiment, a method for forming a conductive feature in a photo-sensitive dielectric material is provided which includes applying a photo-sensitive release layer over the photo-sensitive dielectric material and exposing the photo-sensitive release layer and the photo-sensitive dielectric material so as to define a feature into the photo-sensitive dielectric material. The method also includes developing the photo-sensitive release layer and the photo-sensitive dielectric material so as to define the feature. Then the feature is filled with a conductive material. The release layer is then removed so as to remove the conductive material from over regions other than in the feature.

In yet another embodiment, a method for electroplating copper interconnects is provided which includes generating a stack including a first dielectric layer, a second dielectric layer and a release layer. The method also includes etching away a portion of the release layer and the second dielectric layer exposing a trench through to the first dielectric layer. Then the method applies a barrier layer, a seed layer, and a conformal dielectric layer on the stack after the etching. A portion of the conformal dielectric layer on horizontal surfaces of the stack is then removed. Copper is then plated onto the stack thereby filling the trench with the copper. The method further includes removing the release layer where the removing detaches materials above the release layer from the stack.

The advantages of the present invention are numerous. Most notably, unlike pattern plating, this process is relatively insensitive to pattern density, and may therefore be possible to utilize this process in existing wafer plating tools. In addition, throughput may be greatly increased Optimally, either no CMP or minimal CMP is generally necessary because the process uses a single lithographic exposure, and does not require additional steps to strip the dielectric, remove the seed layer, and replace the dielectric, which are all steps needed by the through-mask plating process. This should lead to considerable cost reduction.

The production of solid copper waste as a result of the lift-off step can be removed from the process liquids readily as opposed to the accumulation of greater bulk of the waste CMP slurry that would be a by-product of a CMP process. Additionally, the heavy metal contaminated wash produced by the need to strip the seed layer (as in through-mask plating) is not produced in the present invention. In addition, it is anticipated that the chemistry to be used will be inexpensive compared with that used for plating small, high aspect ratio, features. Although the process described relates to the filling of a single trench, there is no reason that this process cannot be used for structures such as interleved vias. It may also be extended to 'dual damascene' processing in which the via and line are plated at the same time.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

An invention is described for a method of electroplating of copper lines. In a preferred embodiment, the copper lines have approximately 3–20 microns width and 3–20 microns height, in which the ratio of height to width is near 1 or greater than 1. They are of increasing commercial interest because of the need to reduce the series impedance of interconnects in high speed semiconductor integrated circuits. This invention is a process which enables plating of the bottom of the trenches, as well as the wafer field, while the trench sidewall is protected. It will be obvious, however, to one skilled in the art, that the present invention may be practiced without some or all of these specific details. In other instances, well known process operations have not been described in detail in order not to unnecessarily obscure the present invention.

FIGS. 2 through 10 represents a preferred operational progression of electroplating copper in accordance with the present invention. It should also be understood that the operations reflected by FIGS. 11 and 12 may be substituted for the operations as discussed in reference to FIGS. 9 and 10. Therefore, though the operations discussed herein, the copper electroplating on wafers may be conducted in an efficient, cost effective and optimal manner.

Figure 1:
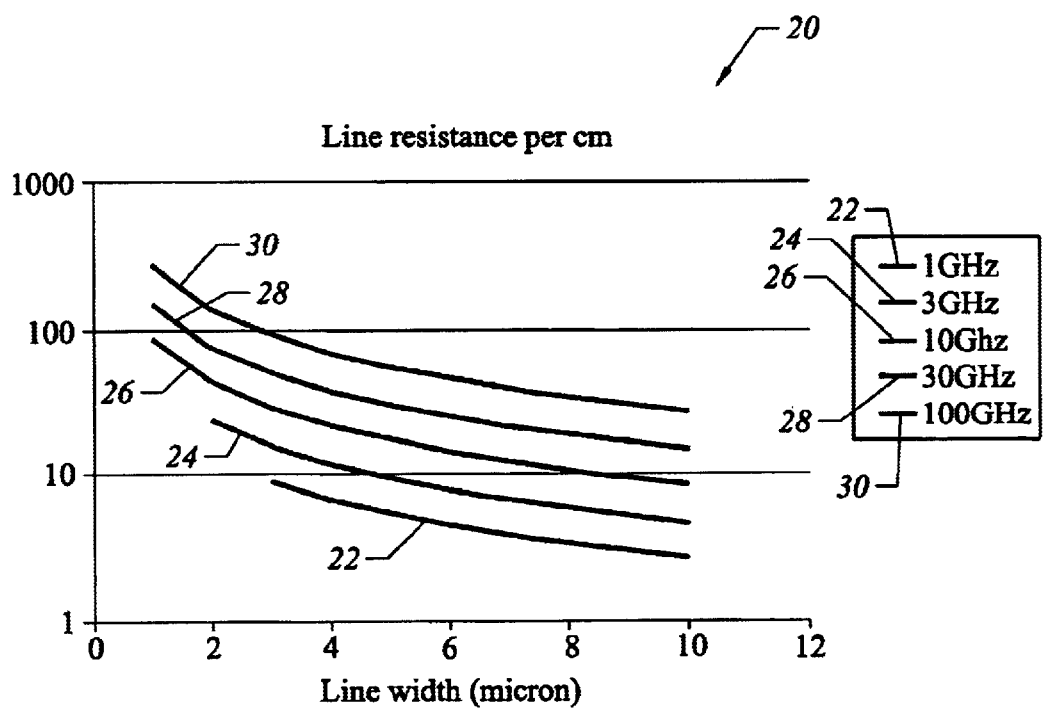
FIG. 1 shows a graph illustrating line resistance per cm for various signal frequencies with a square copper wire of sensitivity 2.0 $\mu\Omega$cm and indicates the approximate resistance per cm of square sectioned copper wires of various dimensions.
Figure 2:
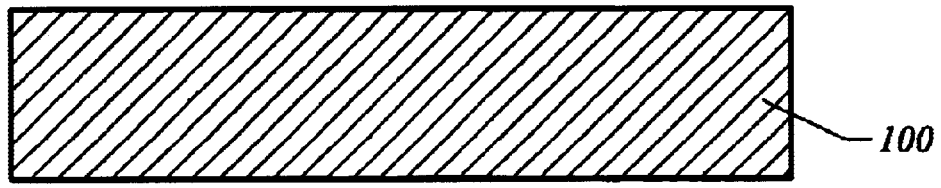
FIG. 2 shows a first dielectric layer in accordance with one embodiment of the present invention.

FIG. 2 shows a first dielectric layer 100 in accordance with one embodiment of the present invention. In this embodiment, the first dielectric layer 100 may be a topmost layer of a metallization stack deposited on a semiconductor wafer, though the process is not limited to that case. It should be understood that the first dielectric layer 100 may be any flexible or rigid polymer substrate, with or without previous layers of metal interconnects embedded in it. In one embodiment, the first dielectric layer may be a silicon dioxide substance. In another embodiment, the first dielectric layer 100 may consist of a ceramic material capable of being directionally etched such as, for example silicon carbide, aluminum nitride, aluminum oxide.

Figure 3:
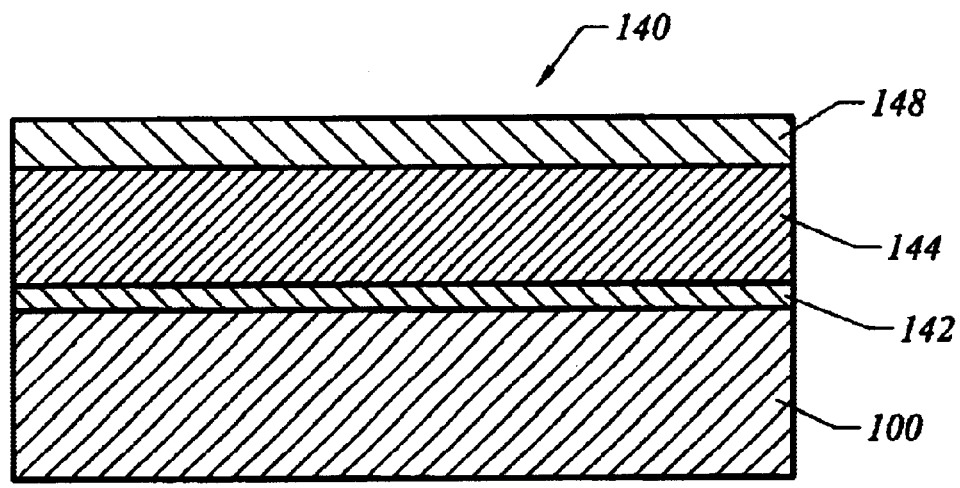
FIG. 3 illustrates a stack generated by application over the first dielectric layer of an optional stop layer, a second dielectric layer in which the copper lines will be inlaid, and a release layer in accordance with one embodiment of the present invention.

FIG. 3 illustrates a stack 140 generated by application over the first dielectric layer 100 of an optional stop layer 142, a second dielectric layer 144 in which the copper lines will be inlaid, and a release layer 148 in accordance with one embodiment of the present invention. The stop layer 142 may be utilized for stopping an etching process but the application and use of such a layer is optional. The stop layer 142 may be any material that may stop etching at the stop layer 142 level. In a preferred embodiment, the stop layer 142 is a silicon nitride material.

It should be understood that the release layer 148 may be any type of material that may be dissolved. In one embodiment, the release layer 148 may be a metal such as, for example, aluminum that is soluble in any bases that will not attack copper. In another embodiment, the release layer 148 may be any polymer that can be dissolved by solvents that are compatible with the existing structures on the wafer. In one embodiment, bases such as, for example, NaOH or KOH may be utilized to dissolve the release layer 148. In a preferred embodiment, the release layer 148 may be a polymer such as, for example, LOL™ 1000 and LOL™ 2000 made by Shipley Company. In a preferred embodiment, the LOL™ 1000 and LOL™ 2000 materials may be dissolved utilizing dyed polydimethylglutarimide (PMGI) solutions which is may be used for lift-off operations with tight critical dimension (CD) control. Such CD lift-off operations are, for example, MR thin film head, gallium arsenide, etc. In addition, the LOL™ 1000 and LOL™ 2000 bilayer liftoff operations may be utilized where metal is sputtered or evaporated onto a material. CD variation may thus be reduced for optimal linewidth control. Other examples of lift-off applications include using a Microposit® SIR® 5138 over LOL™1000 about 2.0 micrometer lines/spaces. Another example includes using a Megaposit® SPR® 510A over LOL® 1000 about 0.7 micrometer lines/spaces. An additional example includes using a Megaposit® SPR® 950 over LOL 1000 about 0.5 micrometer lines/spaces, etc. Further description of the LOL™ 1000 and LOL™ 2000 materials is discussed by a brochure produced by Shipley Company of Marlborough, Mass. called Microposit® LOL™ 1000 and LOL™ 2000 Lift-off Layers. This document is hereby incorporated by reference. A hard mask may be optionally layered over the release layer 148. The release layer 148 may be identical with the optional hard mask layer if made from a suitable material such as, for example, silicon dioxide. If silicon dioxide is utilized as the release layer 148, an HF solution may be utilized to release it.

Figure 4:
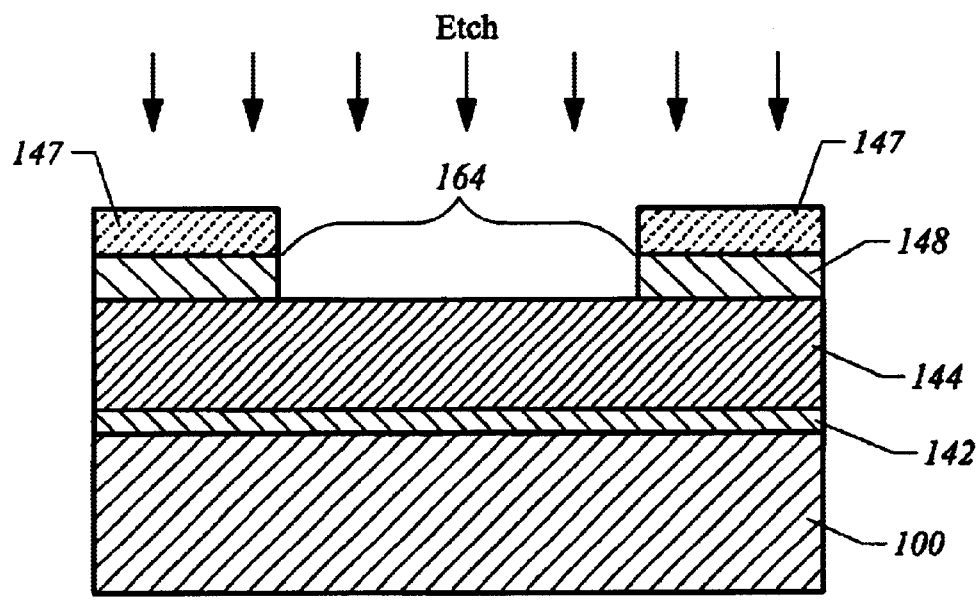
FIG. 4 illustrates the stack where a photoresist is applied and patterned suitably leaving exposed regions in accordance with one embodiment of the present invention.

FIG. 4 illustrates the stack 140 where a photoresist 147 is applied on a top surface of the release layer 148 and patterned suitably leaving exposed regions 164 in accordance with one embodiment of the present invention. The patterning of the release layer forms an exposed outline of a feature over the dielectric layer. It should be understood that the photoresist 147 may be applied and utilized in accordance with generally accepted methods as known by one skilled in the art. The photoresist 147 may then be patterned utilizing any type of light source capable of patterning the photoresist 147. After the photoresist 147 has been patterned and developed to show the exposed regions 147, etching may be conducted to remove the release layer 148 from the exposed regions 147 to reveal a top surface of the second dielectric layer 144. The photoresist 147 may then be removed utilizing a photoresist dissolving chemical that does not attack the second dielectric layer 144 or the release layer 148. As will be seen, the utilization of the release layer 148 assists in the removal of copper from non-trench areas without the requirement of CMP operations.

Figure 5:
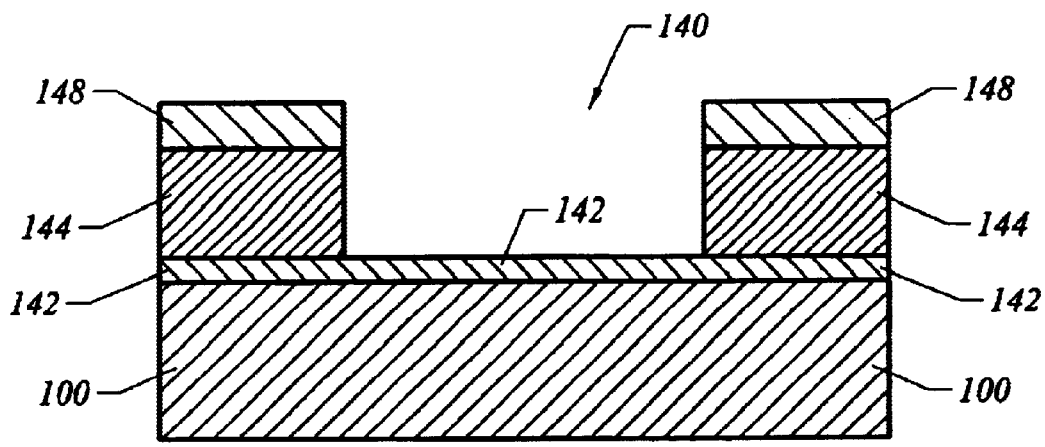
FIG. 5 shows the stack that is etched in accordance with one embodiment of the present invention.

FIG. 5 shows the stack 140 that is etched in accordance with one embodiment of the present invention. In one embodiment, the stack 140 is etched until the trenches (or features) are formed and the trenches reach the correct depth. Trenches are basically openings in the stack 140 where the interconnects may be formed. Trenches may also be known as features or etched features. In one embodiment, the dielectric layer may be etched in the exposed outline of the trench generated above where the etching may generate an etched trench. In a particular exemplary embodiment, if a stop layer is utilized, the correct depth is to a top surface of the stop layer 142. In another embodiment, if a stop layer is not utilized, the correct depth is to a top surface of the first dielectric layer 100. In yet another embodiment, if a hard mask is not being used, the resist is preferably capable of surviving the full etch process for the trench. As described in more detail in reference to FIGS. 6–10, copper will be introduced into the trench generated in this operation to create a copper interconnect.

The structure at this point consists of the second dielectric layer 144 with the release layer 148 above (a hard mask layer may be optionally used and located above the release layer) the first dielectric layer 100 and the stop layer 142 (which is also optional), and a trench through the second dielectric layer 144 and the release layer 148 (and also through the hard mask layer 146 if utilized).

In an alternative embodiment to what is described in reference to FIGS. 2 and 3 above, a photosensitive dielectric may be utilized for the second dielectric layer 144. Photosensitive dielectric such as Dow Chemical® 'Cyclotene®' can be applied to the required thickness, and the release layer 148, which, in this preferred alternative embodiment is transparent in the ultraviolet, is applied. The photosensitive dielectric may then be cured, exposed, and developed. The release layer 148 above the photosensitive dielectric may also be photosensitive so both the exposed parts of the photosensitive dielectric layer and the photosensitive release layer may be removed during the developing operation utilizing developing chemicals effective for the exposed sections of both layers.

In a second alternate embodiment, the photsensitive dielectric can be used where the photosensitive dielectric may then be cured, exposed, and developed. The release layer 148 may then be applied over the photosensitive dielectric. Then photoresist can be applied, cured, exposed, and developed. An etch may then be done to remove the release layer 148 that exists in the previously exposed section of the photosensitive dielectric. The photoresist may then be removed. Therefore, this particular alternative embodiment has multiple patterning and etch steps.

In yet another alternate embodiment, the release layer 148 may be patterned over the second dielectric layer 144. An excimer laser may then be utilized to remove the portions of the second dielectric layer 144 that is exposed to the laser through the pattern in the release layer 148. In a preferred embodiment, the release layer 148 is aluminum that reflects UV light.

In any of the above alternate embodiments, the desired structure may be achieved where a layer of photosensitive dielectric layer exists under the release layer 148 and over the first dielectric layer 100 with a trench existing where the photoresist dielectric layer was exposed to light.

Figure 6:
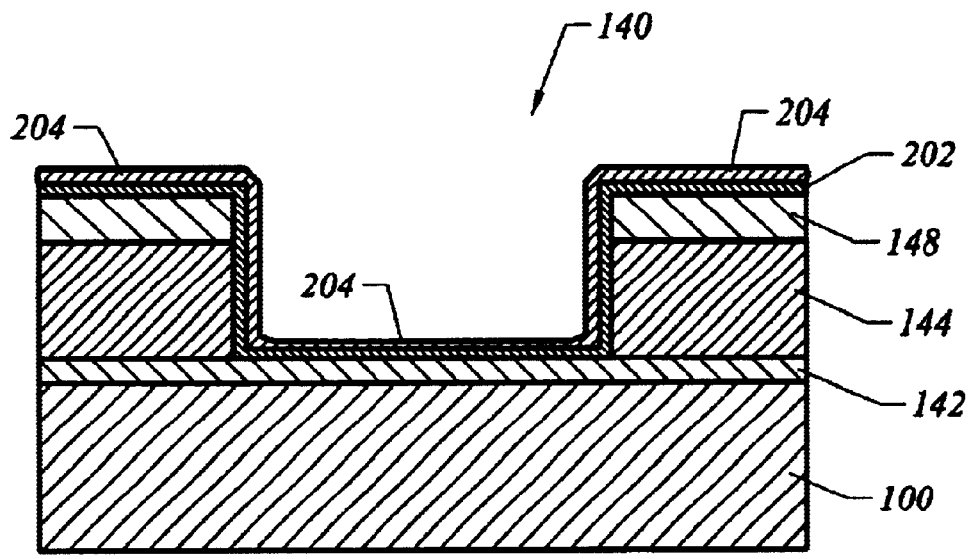
FIG. 6 shows the stack where an optional barrier and adhesion layers are applied, followed by a seed layer in accordance with one embodiment of the present invention.

FIG. 6 shows the stack 140 where an optional barrier and adhesion layers 202 are applied, followed by a seed layer 204 in accordance with one embodiment of the present invention. The barrier layer 202 and the seed layer 204 may be described as a blanket liner and applying the layers 202 and 204 may be described as blanket lining. The blanket lining may preferably cover the release layer and the etched trench. It should be understood that the etch trench may also be a dual damascene opening as described in more detail in reference to FIGS. 11 and 12. The barrier and adhesion layers 202 are optional because depending on the thickness of the second dielectric layer 144, the dielectric may be thick enough to produce satisfactory results without use of a barrier to protect it. In one embodiment, Ti may be utilized as the barrier in the thickness of about 1000 angstroms followed by about 2500 angstroms in thickness of copper as the seed layer 204. In one embodiment, the layers 202 and 204 may be deposited by sputtering. In a preferred embodiment, the layers 202 and 204 may be deposited by chemical vapor deposition (CVD). It should be understood that the seed layer 204 may be any thickness that enables proper plating of the stack 140 in a later plating operation. The seed layer 204 is preferably copper at a thickness of about 100–500 nm.

Electroless deposition could also be used for seed layer 204 deposition. Electroless is a process where a catalytic surface such as a wafer with copper or other metal films can create a deposition of copper from a chemical bath.

Figure 7:
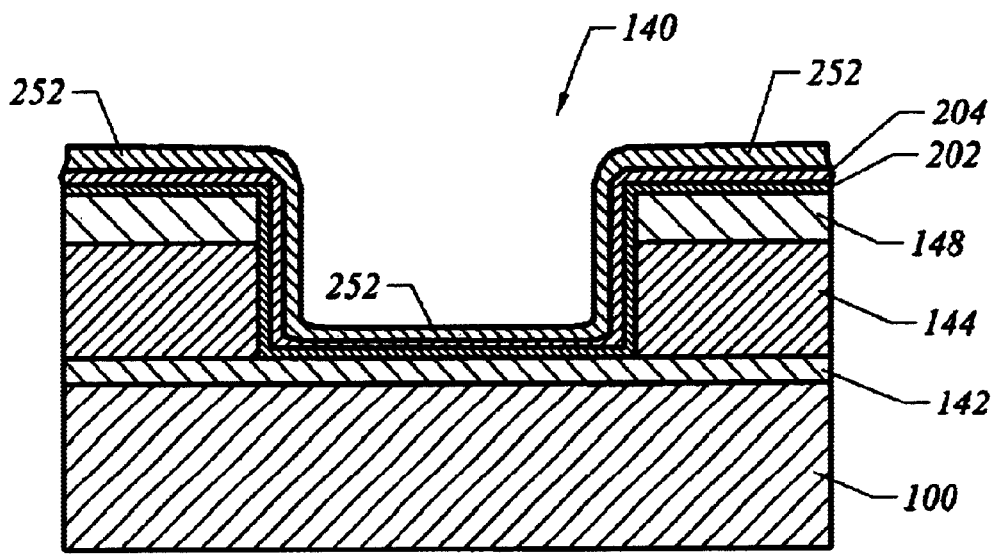
FIG. 7 shows an application of a conformal dielectric layer in accordance with one embodiment of the present invention.

FIG. 7 shows an application of a conformal dielectric layer 252 in accordance with one embodiment of the present invention. In this embodiment, the conformal dielectric layer 252 that is preferably about 100 nm or less in thickness is applied to a top surface of the stack 140. The dielectric that may be utilized here may be the same material utilized in the first dielectric layer 100 and the second dielectric layer 144. In a preferred embodiment, the conformal dielectric layer may be applied by a normal plasma chemical vapor deposition (CVD) at a temperature range of 400 C. plus or minus 100 C.

Figure 8:
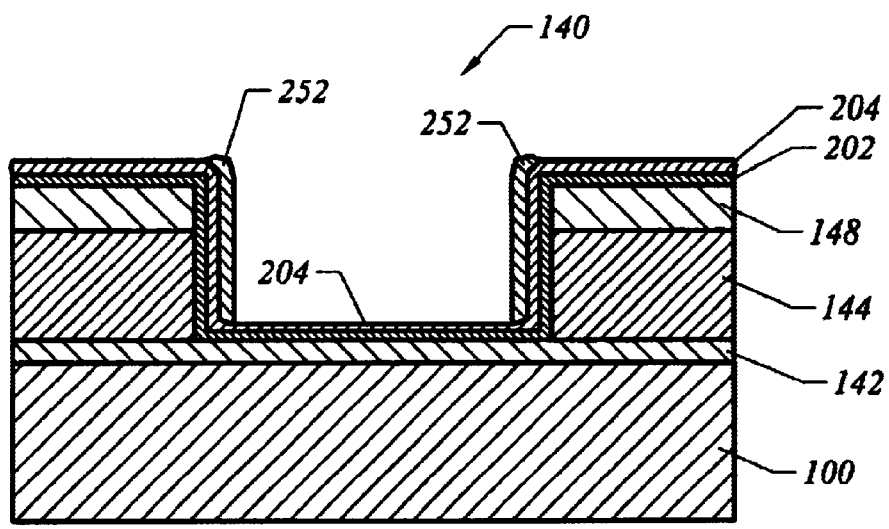
FIG. 8 shows the stack after a directional etch in accordance with one embodiment of the present invention.

FIG. 8 shows the stack 140 after a directional etch in accordance with one embodiment of the present invention. In this embodiment, a directional etch, such as, for example, a sputter etch is used to remove the insulation layer such as, in one embodiment, the conformal dielectric layer 252 from the bottom of the trench (e.g. the top surface of the second dielectric layer 144) and the field, without removing the seed layer 204 from these regions. The field may be defined as locations outside of the trench. The conformal dielectric layer 252 on the sidewall of the trench is essentially untouched.

Figure 9:
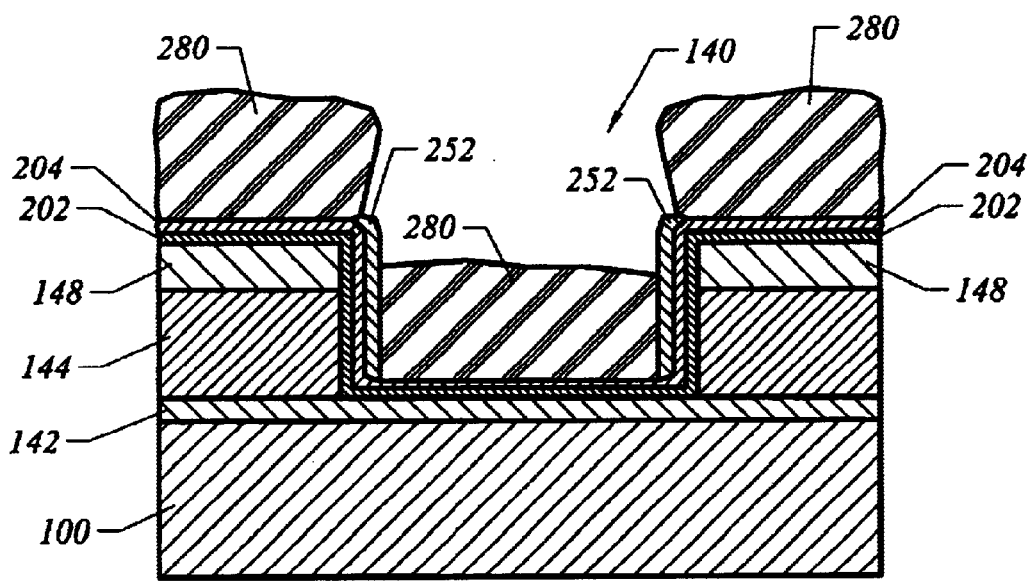
FIG. 9 illustrates the stack when electroplating with copper is carried out until the trench is filled in accordance with one embodiment of the present invention.

FIG. 9 illustrates the stack 140 when electroplating with copper 280 is carried out until the trench is filled in accordance with one embodiment of the present invention. It should be understood that any conductive material such as, for example metals, may be utilized in place of the copper 280. In a preferred embodiment the copper 280 is a copper bulk material that uniformly fills the etch trench. Because of the continuous seed layer 204, electroplating also occurs in the field and pattern dependence is reduced, allowing faster plating than would be possible without this deposition in the field. This occurs because regions with not much seed exposure have a concentrated current in the plating procedure. Therefore, the locations where the current is concentrated may have an accelerated growth rate of plating. Consequently, the current crowding encourages non-uniform plating.

In contrast, when the entire wafer is being plated, there is reduced current concentration and the resultant plating is much more uniform. In addition, in a preferred embodiment, the copper 280 is electroplated so the top of the copper 280 in the trench is approximately even with a top surface of the second dielectric layer 144. Therefore, when the release layer 148 and the materials above it are removed as discussed in further detail in reference to FIG. 10, the resultant top surface of the copper 280 in the trench may be approximately level with the resultant top surface of the stack 140.

Figure 10:
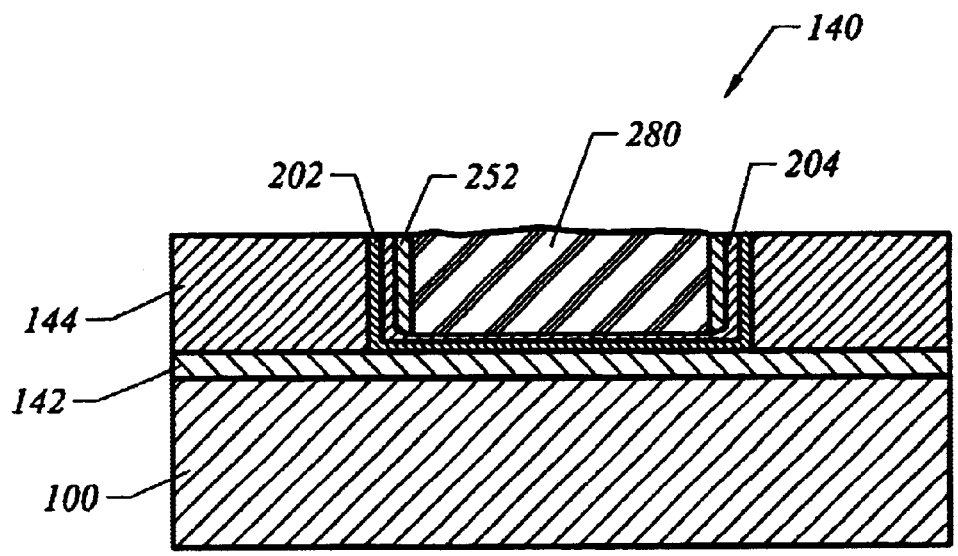
FIG. 10 shows the stack when the release layer and the copper is removed from field in accordance with one embodiment of the present invention.

FIG. 10 shows the stack 140 when the release layer 148 and the copper 280 is removed from field in accordance with one embodiment of the present invention. In this embodiment, the release layer 148 (as discussed in reference to FIG. 4) is dissolved, lifting off the copper 280 that has been deposited in the field along with the barrier and seed layers in the field but leaving the copper 280 occupying the trench. Consequently, the excess copper 280 not occupying the trench may be removed without a polishing process. It should be understood that any method of dissolving the release layer 148 and lifting off the copper 280 from the field may be utilized that preserves the desired copper interconnect structure such as, for example, utilizing solubilizing chemicals. In one embodiment, if aluminum is utilized as the material for the release layer 148, a base may be used such as, for example Sodium Hydroxide, Potassium Hydroxide, Trisodium Phosphate, etc. In an exemplary embodiment, the Sodium Hydroxide may be about 10% concentration diluted in deionized (DI) water utilized at about 30 degrees Celsius to about 70 degrees Celsius. In yet another exemplary embodiment, the Potassium Hydroxide solution may be utilized at about 70 degrees Celsius to about 90 degrees Celsius. In a preferred embodiment, the release layer 148, if made out of aluminum, may be wet etched out utilizing PAN (phosphoric/acetic/nitric acids) with a concentration ratio of about 16 parts phosphoric acid to about 2 parts deionized water to about 1 part acetic acid to about 1 part nitric acid. If a polymeric substance such as LOL 1000 or 2000 is utilized, PMGI (polydimethylglutarimide) may be preferably utilized When the release layer 148 is dissolved or wet etched, the release layer 148 and all of the structures above it can be removed from the stack 140. Therefore, excessive copper plated over the fields may be removed without CMP while leaving the copper 280 still remaining in the trench. CMP may optionally be used to planarize the final structure.

It is known to those skilled in the art that ultrasonics may be utilized in a lift off operaton. An exemplary use of ultrasonics is discussed in the document "Microposit® LOL™ 1000 and LOL™2000 Lift-off layers" that was incorporated by reference above.

Figure 11:
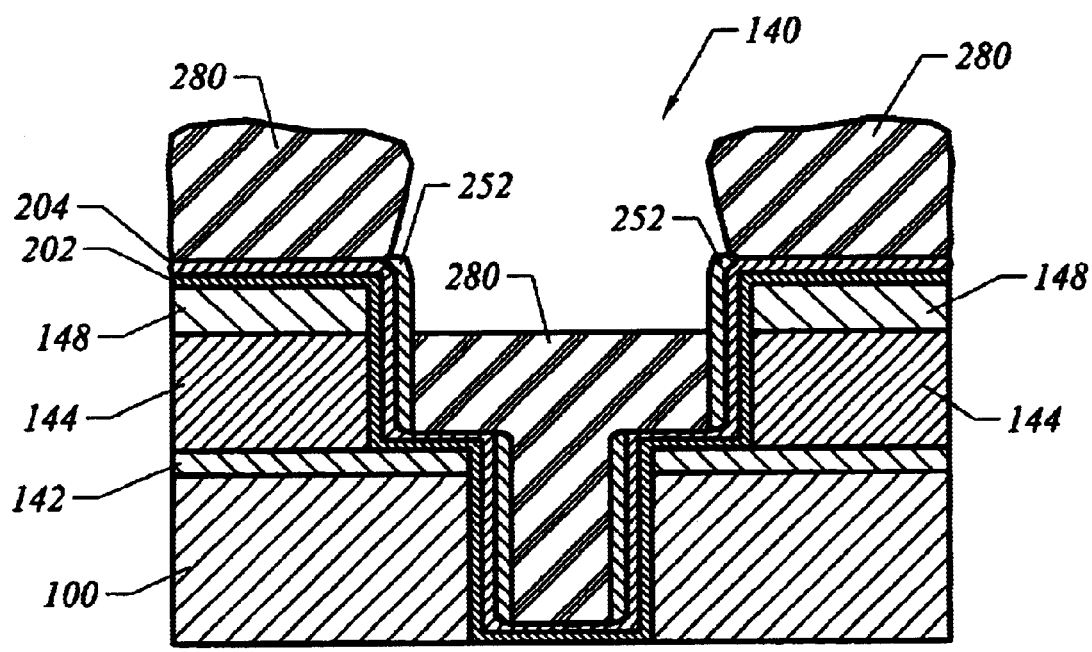
FIG. 11 illustrates an alternate embodiment where the stack has a structure, in addition to the structure as discussed in reference to FIG. 9, that includes a via underneath the trench in accordance with one embodiment of the present invention.
Figure 12:
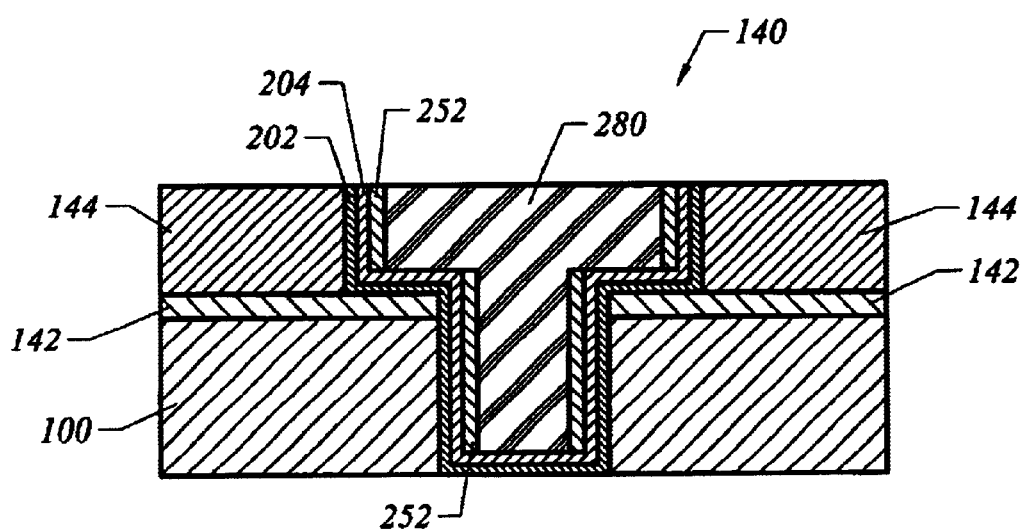
FIG. 12 shows the stack after the release layer may be dissolved away utilizing a solvent in accordance with one embodiment of the present invention.

FIGS. 11 and 12 below enable are alternate embodiments enabling use of the operations discussed above for use in generating multi-level copper formations by incorporating vias into the copper interconnect structure. By use of the operations in FIGS. 11 and 12, dual damascene (with interconnect and vias) structures may be formed by utilizing multiple layers of a conductive material such as, for example copper. Therefore by use of the alternate embodiments, faster, effective, and more efficient method of the present invention can be utilized for complex multi-level structures with reduced use of or elimination of polishing in the process.

FIG. 11 illustrates an alternate embodiment where the stack 140 has a structure, in addition to the structure as discussed in reference to FIG. 9, that includes a via underneath the trench in accordance with one embodiment of the present invention. The via may be formed through photoresist and etching processes. In this alternate embodiment, the copper 280 may be used to fill the via and the trench to form a multi-level copper structure such as dual damascene structures. The methods of applying the copper 280 may be similar to those described above in reference to FIG. 9. When such copper applying has been completed the stack 140 includes both the via and the trench above that are filled with the copper 280. The copper 280 may also accumulate on the fields over the seed layer outside of the trench. The via may extend down to the first dielectric layer 100 through the optional stop layer 142. The via may also be bordered by the seed layer 202 at a bottom end of the via and the conformal dielectric layer 252 on the sides. The rest of the structure is similar to one described in reference to FIG. 9 except that the copper 280 extends from the trench to the via.

FIG. 12 shows the stack 140 after the release layer 148 may be dissolved away utilizing a solvent in accordance with one embodiment of the present invention. In this embodiment, as discussed above in reference to FIG. 10, the release layer 148 may be dissolved and removed using any variety of solvents depending on the material utilized for the release layer 148. The removal process is similar to one that was described in reference to FIG. 10. Therefore, the release layer 148 from the stack 140 as described in reference to FIG. 10 may be dissolved or wet etched and all of the structures above the release layer 148 including the copper 280 accumulated on the fields may be removed without a polishing process. Therefore, the copper 280 in the via and the trench remain while excess copper that was plated outside of the trench is removed. In addition, because the copper 280 was applied so a top surface of the copper 280 was approximately even with a top surface of the second dielectric layer 144, when the release layer 148 is removed, the remaining structure will have the top surface of the copper 280 relatively even with a top surface of the structure. Consequently, the stack 140 after removal of the release layer 148 is similar to the structure as shown in FIG. 11 without the release layer 148 and all of the materials and layers above it.

Such methods and structures as described in FIGS. 11 and 12 may be used to interconnect any number of levels of copper interconnects and vias. Therefore, though a cumulative effect, the efficiencies of utilizing the cost effective and faster methods of the present invention may be increase multiplicatively.

Therefore, the present invention by use the different layers in the stack 140 and the use of the release layer 148 in conjunction with the copper 280 enables removal of excess copper not in the trench without the requirement of CMP or another time consuming procedure that may also require a further step of cleaning contamination as a result of polishing. Consequently, the present invention may decrease the time required to produce copper interconnects and also significantly reduce costs for the generation of the desired copper interconnects.

Any of the operations described herein that form part of the invention are useful machine operations. Any appropriate device or apparatus may be utilized to perform these operations. The apparatus may be specially constructed for the required purposes, or it may be a general purpose computer selectively activated or configured by a computer program stored in the computer. In particular, various general purpose machines may be used with computer programs written in accordance with the teachings herein, where it may be more convenient to construct a more specialized apparatus to perform the required operations.

Although the foregoing invention has been described in some detail for purposes of clarity of understanding, it will be apparent that certain changes and modifications may be practice within the scope of the appended, claims. Accordingly, the present invention is to be considered as illustrative and not restrictive, and the invention is not to be limited to the details given herein, but may be modified within the scope and equivalence of the appended claims.

What is claimed is:

1. A method for forming conductive features in dielectric materials, comprising:

providing a dielectric layer;

forming a release layer over the dielectric layer;

defining a feature into the release layer and the dielectric layer;

filling a conductive material over the release layer and into the feature; and removing the release layer, the removing being configured to remove the conductive material from over the dielectric layer previously covered by the release layer, the removing of the release layer includes chemically dissolving the release layer, and the dissolving includes wet etching;

wherein the wet etching uses a combination of phosphoric acid, acetic acid and nitric acid, mixed with DI water.

2. A method for forming conductive features in dielectric materials as recited in claim 1, wherein the combination includes about 16 parts phosphoric acid, about 2 parts DI water, about 1 part acetic acid; and about 1 part nitric acid.

3. A method for forming conductive features in dielectric materials, comprising:

providing a dielectric layer;

forming a release layer over the dielectric layer;

defining a feature into the release layer and the dielectric layer;

filling a conductive material over the release layer and into the feature; and removing the release layer, the removing being configured to remove the conductive material from over the dielectric layer previously covered by the release layer, the removing of the release layer includes chemically dissolving the release layer, and the dissolving includes wet etching;

wherein the wet etching uses one of a sodium hydroxide solution in DI water and a trisodium phosphate solution in DI water.

4. A method for making copper features in a dielectric layer, comprising:

forming a release layer over the dielectric layer;

etching the release layer to define a location for a feature to be etched into the dielectric layer;

etching into the dielectric layer to define the feature in the dielectric layer;

applying a barrier layer over the release layer and into the feature;

applying a copper seed layer over the barrier layer;

apply a conformal dielectric layer over the copper seed layer;

directionally etching the conformal dielectric layer so as to remove the conformal dielectric layer from top surfaces of the dielectric layer, the top surfaces not including substantially vertical walls substantially in the feature defined in the dielectric layer, the directional etching exposing the copper seed layer over the top surfaces;

applying a copper material over the top surfaces so as to uniformly fill the feature and so as to apply the copper material throughout the dielectric layer in contact with the copper seed layer; and removing the release layer, the removing of the release layer being configured to remove the barrier layer, the copper seed layer and the copper material from all regions other than in the feature.

5. A method for making copper features in a dielectric layer as recited in claim 4, wherein the release layer is selected from one of an aluminum material, a polymer material, and a dissolvable material.

6. A method for making copper features in a dielectric layer as recited in claim 4, wherein the removing the release layer may be accomplished by dissolving the release layer with a chemical.

7. A method for forming a conductive feature in a photo-sensitive dielectric material, comprising:

applying a photo-sensitive release layer over the photo-sensitive dielectric material;

exposing the photo-sensitive release layer and the photo-sensitive dielectric material so as to define a feature into the photo-sensitive dielectric material;

developing the photo-sensitive release layer and the photo-sensitive dielectric material so as to define the feature;

filling the feature with a conductive material; and removing the release layer so as to remove the conductive material from over regions other than in the feature, the removing the release layer includes chemically dissolving the release layer;

wherein chemically dissolving the release layer includes wet etching with a combination of phosphoric acid, acetic acid and nitric acid, mixed with DI water.

\* \* \* \* \*